United States Patent
Jin et al.

(10) Patent No.: US 10,042,759 B2
(45) Date of Patent: Aug. 7, 2018

(54) DUAL SPACE STORAGE MANAGEMENT SYSTEM AND DATA READ/WRITE METHOD

(71) Applicant: Shanghai University, Shanghai (CN)

(72) Inventors: Yi Jin, Shanghai (CN); Shan Ouyang, Shanghai (CN); Yunfu Shen, Shanghai (CN); Junjie Peng, Shanghai (CN); Xuemin Liu, Shanghai (CN)

(73) Assignee: SHANGHAI UNIVERSITY, Shanghai (CN)

( * ) Notice: Subject to any disclaimer, the term of this patent is extended or adjusted under 35 U.S.C. 154(b) by 124 days.

(21) Appl. No.: 15/116,882

(22) PCT Filed: Jun. 19, 2014

(86) PCT No.: PCT/CN2014/080343
§ 371 (c)(1),
(2) Date: Aug. 5, 2016

(87) PCT Pub. No.: WO2015/172419
PCT Pub. Date: Nov. 19, 2015

(65) Prior Publication Data
US 2017/0153974 A1  Jun. 1, 2017

(30) Foreign Application Priority Data

May 12, 2014 (CN) .......................... 2014 1 0199434

(51) Int. Cl.
| | |
|---|---|
| *G06F 12/00* | (2006.01) |
| *G06F 12/06* | (2006.01) |
| *G11C 8/10* | (2006.01) |
| *G11C 8/06* | (2006.01) |

(52) U.S. Cl.
CPC ................ *G06F 12/06* (2013.01); *G11C 8/06* (2013.01); *G11C 8/10* (2013.01)

(58) Field of Classification Search
None
See application file for complete search history.

(56) References Cited

U.S. PATENT DOCUMENTS

| | | | | |
|---|---|---|---|---|
| 5,749,085 A * | 5/1998 | Quillevere | .......... | G06F 12/0207 711/1 |
| 7,865,656 B2 * | 1/2011 | Goto | .................... | G06F 13/1694 711/101 |

* cited by examiner

*Primary Examiner* — John A Lane
(74) *Attorney, Agent, or Firm* — Li & Cai Intellectual Property (USA) Office

(57) ABSTRACT

A computer system includes an addressing assembly, connected respectively to high bits of a memory address line of a processor and high bits of a word address line of a storage, and used to convert, in a preset continuous or discrete range on the storage, high bits of a memory address formed by the processor into high bits of a corresponding word address of the storage and output the high bits to the storage. Low bits of the memory address line of the processor are connected to low bits of the word address line of the storage. The preset range is smaller than or equal to an addressing range of the memory address line of the processor. The processor changes storage units of the storage covered by the preset range by changing the preset range. Thus it reduces cost, improves operation efficiency, shortens operation time, and has wide applicability.

18 Claims, 10 Drawing Sheets

Window place division and management table
Window width: 2MB

| Window place No. | Window position (H) | Mapping window No. (H) | File name | Window place following the file | Note |
|---|---|---|---|---|---|
| 0 | 00 0000 0000 0000 | | | | |
| 1 | 00 0000 0020 0000 | | | | |
| 2 | 00 0000 0040 0000 | | | | |
| 3 | 00 0000 0060 0000 | | | | |
| 4 | 00 0000 0080 0000 | | | | |
| 5 | 00 0000 00A0 0000 | | | | |
| 6 | 00 0000 00C0 0000 | | | | |
| 7 | 00 0000 00E0 0000 | | | | |
| 8 | 00 0000 0100 0000 | | | | |
| 9 | 00 0000 0120 0000 | | | | |
| 10 | 00 0000 0140 0000 | | | | |
| 11 | 00 0000 0160 0000 | | | | |
| 12 | 00 0000 0180 0000 | | | | |
| ...... | ...... | | | | |
| 2147483647 | 00 ffff fffe 0000 | 2046 | Operating system | | Non-closable |
| 2147483648 | 10 0000 0000 0000 | Hidden | | | If the highest address line $AC_{52}$ does not exist in the block manager output lines, this part of window place is non-visible to the external storage |
| 2147483649 | 10 0000 0020 0000 | Hidden | | | |
| ...... | ...... | Hidden | | | |
| 4294967294 | 1f ffff ffc0 0000 | Hidden | | | |
| 4294967295 | 1f ffff ffe0 0000 | Hidden | Underlying software | | |

Figure 6

Mapping window management table

| Mapping window first address (H) | Shift latch set | | File name | Data type | Share permission | Movability | Idle time | Others |
|---|---|---|---|---|---|---|---|---|
| | Mapping window No. | Window place No.(30 bits) | | | | | | |
| 0000 0000 | 0 | W52~W21 | Name of the file belonging to the window place | Read, write and execution | Number of shares available | | | |
| 0020 0000 | 1 | W52~W21 | Name of the file belonging to the window place | Read, write and execution | Number of shares available | | | |
| 0040 0000 | 2 | W52~W21 | Name of the file belonging to the window place | Read, write and execution | Number of shares available | | | |
| 0060 0000 | 3 | W52~W21 | Name of the file belonging to the window place | Read, write and execution | Number of shares available | | | |
| 0080 0000 | 4 | W52~W21 | Name of the file belonging to the window place | Read, write and execution | Number of shares available | | | |
| 00A0 0000 | 5 | W52~W21 | Name of the file belonging to the window place | Read, write and execution | Number of shares available | | | |
| 00C0 0000 | 6 | W52~W21 | Name of the file belonging to the window place | Read, write and execution | Number of shares available | | | |
| 00E0 0000 | 7 | W52~W21 | Name of the file belonging to the window place | Read, write and execution | Number of shares available | | | |
| 0100 0000 | 8 | W52~W21 | Name of the file belonging to the window place | Read, write and execution | Number of shares available | | | |
| 0120 0000 | 9 | W52~W21 | Name of the file belonging to the window place | Read, write and execution | Number of shares available | | | |
| 0140 0000 | 10 | W52~W21 | Name of the file belonging to the window place | Read, write and execution | Number of shares available | | | |
| ...... | ...... | | | | | | | |
| FFC0 0000 | 2046 | 7fff ffff | Operating system | Read, write and execution | Infinite | Not | 0 | |
| FFE0 0000 | 2047 | 7fff ffff | Underlying control software of the system | Read, write and execution | Infinite | Not | 0 | |

Figure 7

DUAL SPACE STORAGE MANAGEMENT SYSTEM AND DATA READ/WRITE METHOD

TECHNICAL FIELD

The present invention relates to the technical field of data call, and particularly to a computer system and a data read/write method.

DESCRIPTION OF RELATED ART

In the existing computer system, generally two storage modes exist, that is, external storage and internal memory. The external storage refers to the storage apparatus other than the computer's memory and CPU cache, and is characterized in that the data can still be stored after power off. The common external storage in a computer system includes a floppy disk storage, a hard disk storage, an optical disk storage, and others, and hard disk is generally used in a microcomputer system at present. The internal memory refers to a memory for storing the data and program being used by CPU at present, and exchanging data with an external storage such as hard disk. As long as the computer runs, the CPU calls the data to be operated to the internal memory for operation, and transfers the result out after operation. The internal memory is volatile as soon as power off that determines the temporariness of it. The internal memory in a conventional computer system consists of a memory chip, a circuit board, and a gold finger etc.

In the design concept of a computer system, the design object of the internal memory space is to construct a memory that the CPU can randomly read from and write in (in units of word or byte), and the design object of the external storage space is to store data as much as possible in a limited space. Therefore, N+1 (N is a positive integer) address lines are built in the internal memory space to randomly address the memory units in the memory, and the data bits in each memory unit equals to the width of the data bus of CPU. Such a memory structure allows the internal memory space to comprise only $2^{N+1}$ memory units, and the memory capacity of the whole internal memory space is only $2^{N+1}$ words (or bytes). For the external storage space, an external storage unit may be constructed which is addressed with an address represented by software, that is, "block number" and the data bits in each external storage unit is the "block capacity". Because the address bits represented by software are far greater than the number N+1 of the address lines constructed by CPU, the address bits in the external storage space are much more than the address bits in the internal memory space. Furthermore, because the bits of data stored in the "block capacity" are much more than the width of the data bus of CPU, the storage capacity of the external storage space is also far greater than that of the internal memory space. Moreover, because the address in the external storage space is represented by software, the external storage space can only be accessed by the underlying software of the system, and CPU cannot directly perform a read and write operation on the external storage unit in the external storage space by way of machine instruction.

In summary, in a conventional computer system, if the data saved in the external storage space needs to be retrieved, CPU should call the data in the external storage space into the internal memory space, and then randomly address and access it by way of machine instruction. Therefore, the mapping between the internal memory space and the external storage space is realized in the manner of content copy, that is, memory relocation technology. The so-called memory relocation technology means a process in which in the addressing of data, a logical address space of a program is converted into an actual physical address space in the internal memory. The method is specifically as follows. When CPU intends to access the data on the external stage by using a machine instruction, CPU sends a request to the underlying software, and then the underlying software addresses the external storage, copies the found data into the internal memory at block as unit, informs the CPU of the memory address of the copy, and performs a read and write operation on the copy by way of machine instruction. The conventional data call method has an obvious defect, that is, there are quantities of data copied between the internal memory and the external storage, which delays the access to the data by CPU under a machine instruction. Long-time data call may easily cause the congestion of a data transmission channel between the internal memory and the external storage, thereby increasing the operation time for transferring and calling data and consuming more system resources.

Chinese Patent No. CN1403921 discloses a data exchange and storage method and apparatus, which falls in the technical field of data processing. By using the method and apparatus, data exchange between various storage devices including removable storage disk as external storage device and memory card and between both of them and the host of the data processing system is realized, or storing data read from one party into any one or two of the three parties is realized. The apparatus itself in this technical solution has data processing capability, and the data in the external storage device can be stored in an internal memory module, or the data in the internal memory module can be stored in an external storage, while the apparatus is not connected to the host of the system. The technical solution is still limited to the description of and improvement on the data exchange between the external storage (external storage device) and the internal memory (internal memory module), and failed to solve the problem existing in the prior art.

Chinese Patent No. CN101000590 discloses a method for reading data in an internal memory, in which a sampling clock DATA_CLK having a phase difference Tph from a master clock MCLK of an internal memory controller is set. The method includes the following steps. A. The internal memory controller sends a read control signal and a read address to the internal memory in a master clock domain. B. The internal memory controller receives, in a sampling clock domain, data stored in the read address that is output from the internal memory, and buffers the received data. C. The internal memory controller reads the buffered data in the master clock domain. A system for reading data in an internal memory is also disclosed in the patent. The technical solution only concerns a data exchange process between the internal memory and the processor, that is, a process of reading data from the internal memory by the processor, thus being failed to solve the problem existing in the prior art.

SUMMARY OF THE INVENTION

In view of the problem existing in the prior art that the conventional data call method causes the congestion of a transmission channel between the external storage space and the internal memory space, thus increasing the operation time of data transmission and data call, and consuming more system resources. A computer system and a data read/write operation method are provided by us now.

Specifically, a computer system includes a processor and a storage. The storage comprises multiple storage units and is divided into multiple storage blocks of the same size. Each storage unit has a word address and is accessed via a word address line. Each storage block has a block address and is accessed via a block address line. The computer system further includes:

An addressing assembly, connected respectively to high bits of a memory address line of the processor and high bits of the word address line of the storage, and used to convert, in a preset continuous or discrete range on the storage, high bits of a memory address formed by the processor into high bits of a corresponding word address of the storage and output the high bits to the storage.

Low bits of the memory address line of the processor are connected to low bits of the word address line of the storage.

The preset range is smaller than or equal to an addressing range of the memory address line of the processor.

The processor changes the storage units of the storage covered by the preset range by changing the preset range.

Preferably, the addressing assembly includes a plurality of latch units. Outputs of each latch unit are connected to the high bits of the word address line of the storage. Each latch unit stores the high bits of the word address of one storage unit. The storage units of the storage covered by the high bits of the word addresses of the storage units stored in all the latch units form the preset range. The processor changes the preset range by changing the high bits of the word addresses of the storage units stored in the latch units.

Preferably, the addressing assembly includes a first decoder unit. Inputs of the first decoder unit are connected to the high bits of the memory address line of the processor. Outputs of the first decoder unit are connected respectively to each latch unit. The first decoder unit gates a corresponding latch unit for output according to the high bits of the memory address formed by the processor.

Preferably, the storage unit of the storage is divided into a plurality of regions of the same size according to the word address. The high bits of the word address stored in each latch are the high bits of the first address of the region.

When the processor changes the high bits of the word address of the storage unit stored in the latch unit, the processor selects a region where a current target file resides, and assigns the high bits of the first address of the selected region to one latch unit.

Preferably, the plurality of latch units include at least one first-class latch unit, and the high bits of the word address of the storage unit stored in the first-class latch unit are non-modifiable.

Preferably, the region where the word address corresponding to the high bits of the word address of the storage unit stored in the first-class latch unit resides is configured to store an operating system.

Preferably, when the preset range is smaller than the addressing range of the memory address line of the processor, the write ports of all the latch units are addressed into the addressing range of the memory address line of the processor, and connected to the low bits of the memory address line of the processor.

Preferably, the addressing assembly includes a second decoder unit. Inputs of the second decoder unit are connected respectively to the outputs of each latch unit. Outputs of the second decoder unit are connected to the storage. The second decoder unit is configured to address the high bit portion of the word address of the storage according to the high bits of the word address of the storage that are output from the selected latch unit.

Preferably, the latch unit is mainly formed of a set of latches.

Preferably, the first decoder unit is mainly formed of a set of decoder chips.

Preferably, the second decoder unit is mainly formed of a set of decoder chips.

Another aspect of the present invention provides a data read/write method, which is applied to the above computer system and includes specifically the steps:

Step 1: determining whether a target file of a read/write request is stored in a set of storage units currently covered by the preset range, wherein if the target file is stored in the set of storage units currently covered by the preset range, Step 2 is performed, or otherwise, Step 6 is performed;

Step 2: generating a memory address by the processor, wherein high bits of the memory address are sent to the addressing assembly, and low bits of the memory address are sent to the storage;

Step 3: converting the high bits of the memory address into high bits of a corresponding word address of the storage and outputting the high bits to the storage by the addressing assembly;

Step 4: combining the high bits of the word address that are output from the addressing assembly and the low bits of the memory address into a word address of the storage, and gating a storage unit corresponding to the word address to connect with the processor, for performing a read/write operation;

Step 5: performing a read/write operation on data bus in a current working memory by the processor by means of memory read/write, and exiting to wait for a next read/write request; and Step 6: changing the set of storage units of the storage covered by the preset range by the processor, such that the target file of the read/write request resides in the set of storage units of the storage covered by the preset range, and continuing the process by proceeding to Step 2.

The technical solution has the following beneficial effects.

1) The external storage and the internal memory in a computer system are integrated, whereby decreasing the chip structure of the internal memory which is necessary to a conventional system, so that the manufacturing cost of the entire computer system is reduced.

2) In calling of data in the external storage, it has no need to send a copy of data to the internal memory, and no need to update the data in the external storage after being modified, such that the congestion of a transmission channel caused by long-time data call is avoided, and the data exchange time is reduced, thus increasing the operating efficiency of the system.

3) No data exchange exists between the internal memory and the external storage, such that the requirement for memory hit rate is lowered, thus reducing the requirement for the operating system, and increasing the operating efficiency of the operating system.

4) The data is directly read and written in the external storage space, thus shortening the operation time of a reading and writing operation.

5) The conventional hardware storage structure is not changed greatly. The computer system is convenient to use and has wide applicability.

BRIEF DESCRIPTION OF THE DRAWINGS

FIG. 6 is a schematic structural view of a mapping window place division and management table according to a preferred embodiment of the present invention;

FIG. 7 is a schematic structural view of a mapping window management table according to a preferred embodiment of the present invention.

DETAILED DESCRIPTION OF THE PREFERRED EMBODIMENTS

The present invention is further described below with reference to accompanying drawings and specific embodiments; however, the present invention is not limited thereto.

In a preferred embodiment of the present invention, in view of the problems existing in the prior art that in a conventional computer system, as the internal memory is separated from the external storage, data is frequently copied and transmitted between the internal memory and the external storage when the system calls the data, a technical solution is proposed that two kinds of storage space are constructed in a storage, and data read/write is performed on the storage. The technical solution specifically includes the following.

Figure 1:
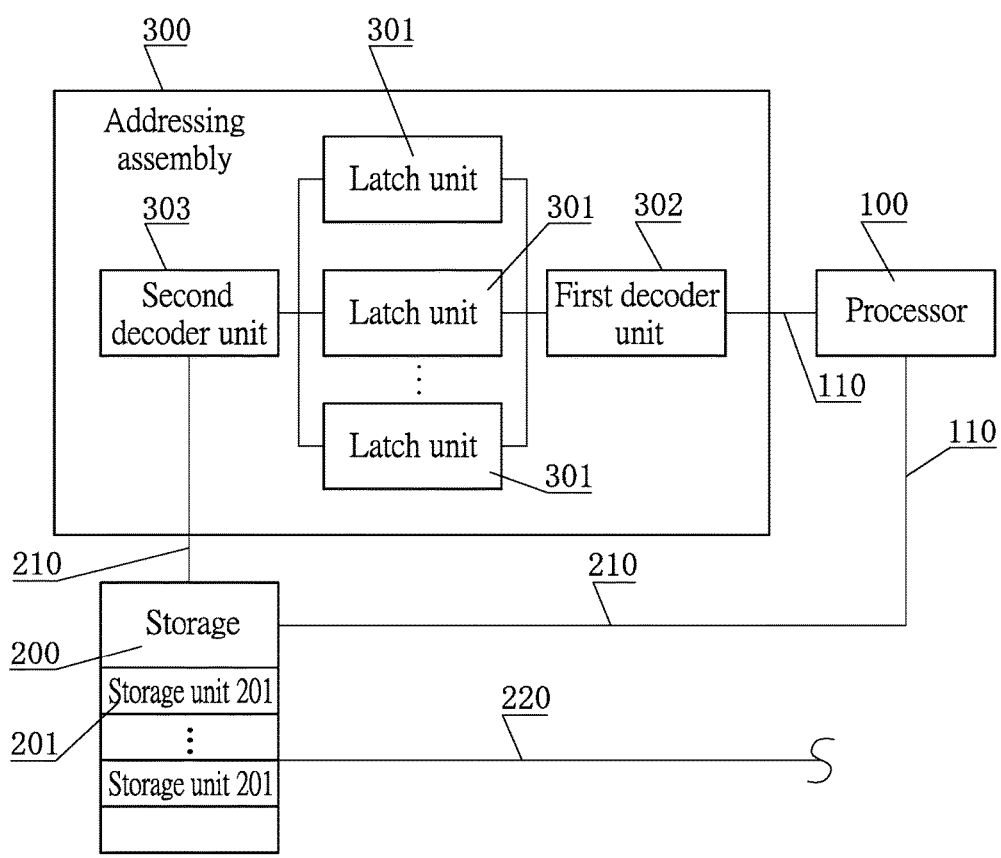
FIG. 1 is a schematic structural view of a computer system according to a preferred embodiment of the present invention.
Figure 2:
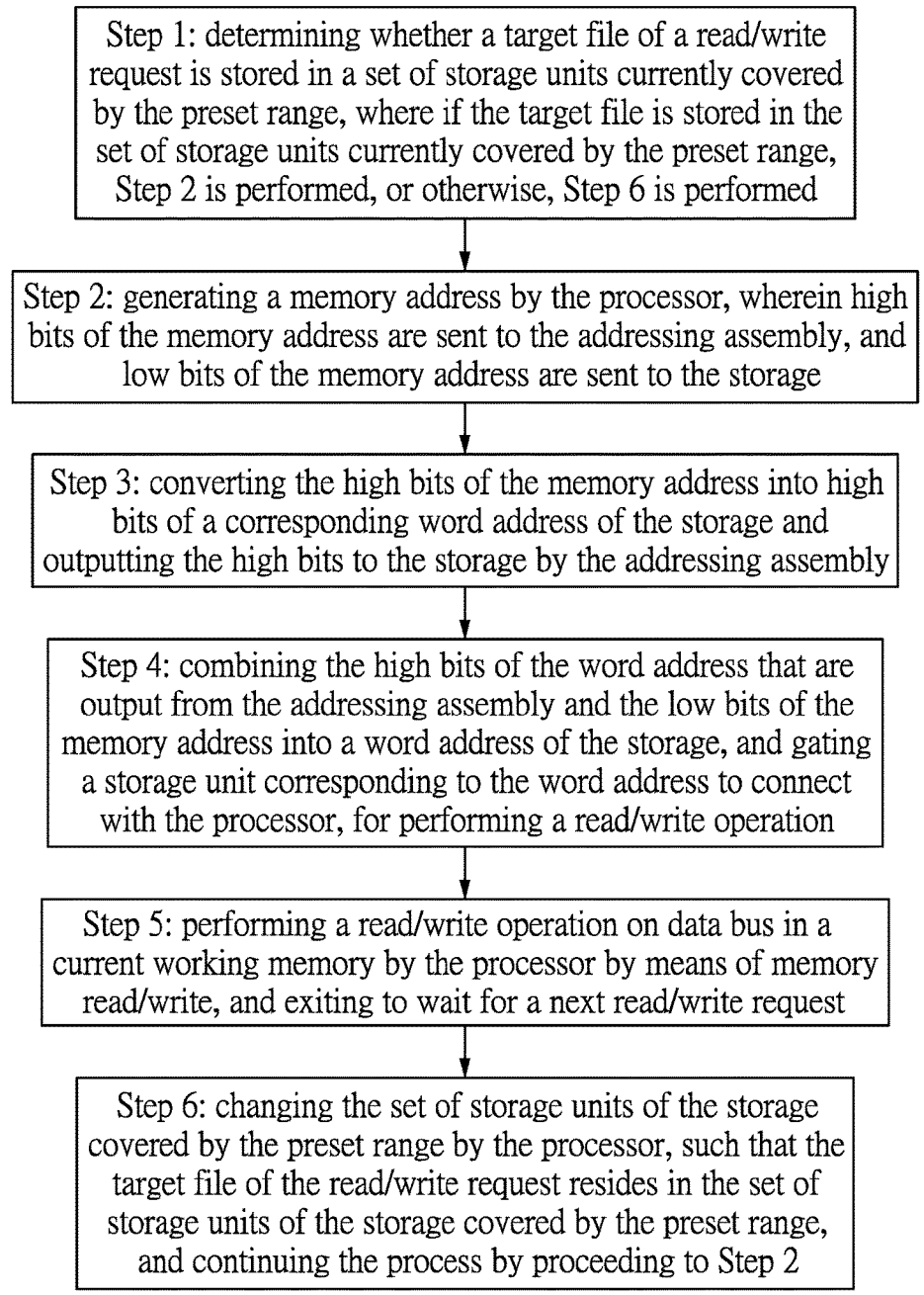
FIG. 2 is a schematic process flow chart of a data read/write method according to a preferred embodiment of the present invention.

As shown in FIG. 1, in a preferred embodiment of the present invention, a computer system includes a processor 100 and a storage 200. The storage 200 includes multiple storage units and is divided into multiple storage blocks of the same size. Each storage unit has a word address, and is accessed via a word address line 210. Each storage block has a block address, and is accessed via a block address line 220. The mode of access via the block address line 220 is a mode in the prior art that the system accesses an external storage. Because this mode is not an object of the present technical solution, the access to the storage 200 by the system via the block address line 220 is not described.

The computer system further includes an addressing assembly 300, connected respectively to high bits of a memory address line 110 of the processor 100 and high bits of the word address line 210 of the storage 200, and used to convert, in a preset continuous or discrete range on the storage 200, high bits of a memory address formed by the processor 100 into high bits of a corresponding word address of the storage 200 and output the high bits to the storage 200.

Low bits of the memory address line 110 of the processor 100 are connected to low bits of the word address line 210 of the storage 200.

The preset range is smaller than or equal to an addressing range of the memory address line 110 of the processor 100.

The processor 100 changes the storage units of the storage 200 covered by the preset range by changing the preset range.

In the above technical solution, the preset range on the storage 200 is equivalent to the internal memory in the prior art, and the access to the range by the processor 100 via the addressing assembly 300 is equivalent to the access to the internal memory by the processor in the prior art. In case that a target file does not reside in the preset range, that is, the target file does not reside in the internal memory in the prior art, the processor 100 changes the storage units of the storage 200 covered by the preset range, such that the target file falls within the preset range, which is equivalent to the copying of the target file in the external storage into the internal memory in the prior art. In the above technical solution, by defining a preset range on the storage 200 and by changing the storage units covered by the preset range by the processor 100 as desired, the access to the internal memory and the external storage by the system in the prior art is implemented on the storage 200. Therefore, the internal memory and external storage need not to be disposed separately, thereby saving resources. In the technical solution according to the present invention, the data exchange between the internal memory and the external storage that previously requires a large number of read/write operations is replaced by changing the storage units covered by the preset range, thereby greatly reducing the overhead and increasing the operating speed of the system.

Further, in the above technical solution, the addressing assembly 300 converts the high bits of the memory address formed by the processor 100 into the high bits of a word address of the storage 200, which is combined with the low bits of the memory address formed by the processor 100, to achieve the access by the processor 100 on the storage 200 having a capacity that is greater than the addressing capability of the processor 100. Meanwhile, the storage unit covered by the preset range may be changed by changing the conversion strategy of the addressing assembly 300.

It should be noted that the address conversion strategy of the addressing assembly 300 may be implemented by hardware or software, which is not limited implementation mode in the present invention. As an illustration for the feasibility of the present invention, the technical solution is further described below with implementation of conversion by hardware.

In a preferred embodiment of the present invention, the addressing assembly 300 may include multiple latch units 301. The outputs of each latch unit 301 are connected to the high bits of the word address line 210 of the storage 200. Each latch unit 301 stores the high bits of the word address of one storage unit. The storage units of the storage 200 covered by the high bits of the word addresses of the storage units stored in all the latch units 301 form the preset range. The processor 100 changes the preset range by changing the high bits of the word addresses of the storage units stored in the latch units 301.

In the implementation of the addressing assembly 300, the preset range is delimited by the high bits of the word addresses of the storage units of the storage 200 stored in all the latch units 301, and the preset range may be continuous or discrete. Moreover, the processor 100 may change the high bits of the word address(es) of the storage unit(s) stored in 1, or several or all the latch units 301 once, thereby achieving the partial or complete change of the preset range as desired.

In a preferred embodiment of the present invention, the addressing assembly 300 may further include a first decoder unit 302. The inputs of the first decoder unit 302 are connected to the high bits of the memory address line 110 of the processor 100. The outputs of the first decoder unit 302 are connected respectively to each latch unit 301. The first decoder unit 302 gates a corresponding latch unit 301 for output according to the high bits of the memory address formed by the processor 100.

It should be noted that the utilization of the first decoder unit 302 in combination with the latch units 301 is merely an implementation of the address conversion strategy of the addressing assembly 300 in the technical solution of the present invention, and the protection scope of the present invention is not limited thereto. In a preferred embodiment of the present invention, the storage units of the storage 200 are divided into a plurality of regions of the same size according to the word addresses, and the high bits of the word address stored in each latch unit 301 are the high bits of the first address of the region.

When the processor 100 changes the high bits of the word address of the storage unit of the storage 200 stored in the latch unit, the processor selects a region where a current target file resides, and assigns the high bits of the first address of the selected region to one latch unit 301.

In the above technical solution, the storage 200 is logically partitioned to define a plurality of regions of the same size, and the high bits of the word address of the storage 200 stored in one latch unit 301 just cover one region, such that when the processor 100 changes the high bits of the word address of the storage 200 stored in the latch unit 301, the high bits of the first address of the selected region are directly assigned to one latch unit 301. In this manner, the narrowing of the actual capacity of the preset range due to the overlap of the regions corresponding to the latch units 301 and thus the reduction of the addressing capability of the processor 100 can be avoided.

In a preferred embodiment of the present invention, the multiple latch units 301 include at least one first-class latch unit and the high bits of the word address of the storage unit stored in the first-class latch unit are non-modifiable. The first-class latch unit may be directed to a region where a file is frequently accessed by the system, to avoid the reduction in the operating efficiency of the system caused by the frequent change of the preset range by the system.

In a preferred embodiment of the present invention, the region where the word address corresponding to the high bits of the word address of the storage unit stored in the first-class latch unit resides is configured to store an operating system. The operating system is generally a file that is most frequently accessed by the computer system, and has a fixed position on the memory device. Therefore, applying the region where the word address corresponding to the high bits of the word address of the storage unit stored in the first-class latch unit to store the operating system can promote the operating efficiency of the operating system.

In a preferred embodiment of the present invention, the addressing assembly 300 includes a second decoder unit 303. The inputs of the second decoder unit 303 are connected respectively to the outputs of each latch unit 301. The outputs of the second decoder unit 303 are connected to the storage 200. The second decoder unit 303 is configured to address the high bit portion of the word address of the storage 200 according to the high bits of the word address of the storage that are output from the selected latch unit 301.

In a preferred embodiment of the present invention, the latch unit 301 is mainly formed of a set of latches.

The technical solution of the present invention further includes a data read/write method, which may be applied to the above computer system and includes specifically the steps:

Step 1: determining whether a target file of a read/write request is stored in a set of storage units currently covered by the preset range, where if the target file is stored in the set of storage units currently covered by the preset range, Step 2 is performed, or otherwise, Step 6 is performed;

Step 2: generating a memory address by the processor, wherein high bits of the memory address are sent to the addressing assembly, and low bits of the memory address are sent to the storage;

Step 3: converting the high bits of the memory address into high bits of a corresponding word address of the storage and outputting the high bits to the storage by the addressing assembly;

Step 4: combining the high bits of the word address that are output from the addressing assembly and the low bits of the memory address into a word address of the storage, and gating a storage unit corresponding to the word address to connect with the processor, for performing a read/write operation;

Step 5: performing a read/write operation on data bus in a current working memory by the processor by means of memory read/write, and exiting to wait for a next read/write request; and Step 6: changing the set of storage units of the storage covered by the preset range by the processor, such that the target file of the read/write request resides in the set of storage units of the storage covered by the preset range, and continuing the process by proceeding to Step 2.

Some specific embodiments are described below to clarify the main ideas of the present invention. Before this, some terms are defined. The definitions of the terms below are provided in the specific embodiments merely for explaining the technical solution of the present invention in detail to facilitate the persons of skill in the art to have a deep insight on the technical solution of the present invention, rather than limiting the protection scope of the present invention.

Block address: serial number of a sequence of storage units 201 in unit of data blocks on the storage 200, that is, the serial number of storage address when the system accesses the storage 200 by means of the external storage read/write mode via the addressing assembly 300 and the block address line 220.

Block space: a sequence consisting of all the block addresses. In a preferred embodiment of the present invention, the block space is a storage space on the storage 200 connected by the block address line 220, that is, the conventional external storage space.

Word address: serial number of storage units 201 in unit of data width in memory space on the storage 200. In an existing computer system, the data width in the internal memory space equals to the width of the data bus of the processor 100 (CPU).

Word space: a sequence consisting of all the word addresses. In a preferred embodiment of the present invention, the word space is a memory space on the storage 200 connected by the word address line 210.

It should be noted that both the word space and the block space are directed to the same storage, that is, the word address line 210 and the block address line 220 are connected respectively on the same storage.

Dual space storage: a storage having a block space and a word space, that is, a storage having a word address line and a block address line connected respectively on the same storage, namely, the storage 200 described in preferred embodiments of the present invention.

Mapping window: a segment of continuous and non-partitionable definite memory address range that can be designated to a local range on the word space of the storage 200. In a preferred embodiment of the present invention, one mapping window corresponds to a segment of continuous memory address of one region, and the region corresponding to all the mapping windows forms the preset range.

Current mapping window: a mapping window accessed under a current machine instruction of the processor 100 (referred to as CPU hereinafter). In a preferred embodiment of the present invention, the current mapping window is a region where a currently gated storage unit of the storage resides.

First address of mapping window: a minimum memory address included in a mapping window.

Mapping window width: total number of memory addresses included in a mapping window. In a preferred embodiment of the present invention, the window width of a mapping window equals to the maximum memory address minus the first address of the mapping window plus 1.

Mapping window number: serial number of a mapping window.

Window place: a continuous storage unit of the word space of dual space storage can just install a mapping window. In a preferred embodiment of the present invention, a window place is a set of multiple continuous storage units corresponding to one mapping window in the storage 200, that is, the region in preferred embodiments of the present invention.

Window place number: serial number of a window place.

Window position: an address of a word space of the storage 200, to which a first address of a mapping window may be designated. In a preferred embodiment of the present invention, it is commonly understood that the window position is a position where a mapping window is positioned on the word space.

Shift latch: indicating a current window position of a mapping window, the value of which corresponds to a window place number of a window place where the mapping window resides, that is, the latch unit 301 mentioned in preferred embodiments of the present invention.

Shift latch set: a sequence list of all the shift latches.

Shift latch number: serial number of a shift latch in the shift latch set. When the shift latches are ranked according to the mapping window number, the shift latch number is the same as the mapping window number.

Shift: an operation in which a mapping window is designated to a window place. In a preferred embodiment of the present invention, shift is achieved by changing the value stored in the latch unit 301.

Open window: a current state of a window place with a mapping window designated.

Closed window: a current state of a window place without a mapping window designated.

Non-closable window: a window place that a mapping window designated thereto cannot be shifted, that is, a region that the first-class latch unit is directed to in preferred embodiments of the present invention.

Current window place: a window place where a current mapping window resides, that is, a region that a latch unit 301 gated by the first decode unit 302 is directed to in preferred embodiments of the present invention.

In a preferred embodiment of the present invention, based on the definitions of the terms above, the object of the present invention is outlined as follows: High bits of a memory address formed by CPU are converted by the addressing assembly 300 into high bits of a word address of the storage 200, that is, window position of a mapping window, which are combined with low bits of the memory address formed by CPU, to form the word address of the storage 200. In this way, a storage unit in a preset range on the storage 200 is gated. When a target file of a read/write request falls outside the preset range, the preset range is rebuilt by changing the position(s) of one or more mapping windows forming the preset range on the storage 200, such that the one or more mapping windows are shifted to a window place where the target file of the read/write request resides. As a result, the rebuilt preset range includes the storage unit where the target file of the read/write request resides. The computer system designed in accordance with the object of the invention needs only one storage, and no distinction is made between internal memory and external storage. However, a block space and a word space are both constructed on the storage. Because the access to the block space is not a direction toward which the improvement in the present invention is made, the access modes of the block space in the prior art may be used, which are not described herein. In a preferred embodiment of the present invention, the storage thus structured is referred to as dual space storage. The CPU regionally randomly accesses the word space of the dual space storage through the mapping window in the internal memory space, thus addressing the problem of transfer of quantities of data between the internal memory and the external storage in a conventional computer system.

Briefly, the technical solution for accomplishing the above object is a method for mapping an internal memory to dual space storage in a computer. By using a set of shift latches, the word address in a mapping window partitioned on a memory space is mapped onto a segment of equally and continuously addressed word space address on the word space of the dual space storage. After mapping, the CPU accesses the word address in the mapping window, such that a random access operation of the segment of word space on the dual space storage is realized. By changing the value in a shift latch in the set of shift latches, the memory address corresponding to the corresponding mapping window is mapped to another position on the word space of the dual space storage, that is, the mapping window is moved to another position. In a preferred embodiment of the present invention, the movement may be visually considered as a shift operation of the mapping window of the internal memory space.

In a preferred embodiment of the present invention, the word space on the dual space storage is different from the internal memory space in that the storage capacity of the internal memory space depends on the number of the memory address line of CPU, and generally equals to the bits of physical address given in a machine instruction of a computer system. However, in a preferred embodiment of the present invention, the capacity of the word space on the dual space storage is not limited by the number of the memory address line of CPU.

In a preferred embodiment of the present invention, the word space is correlated with the block space by the fact that they are address space on the same storage (that is, dual space storage), so that the total storage capacity identified by both of them are the same. That is, the size of the block space multiplying the block capacity equals to the size of the word space multiplying the word length. This determines the fact that if the block capacity is $2^X$ words (x is a positive integer), that is, the word inside the block is addressed by a X-bit word addressing line, which is generally low x bits of the word space address, and then the bits higher than x in the word space address equal to the bits of the block space address, that is, the bits of the word address addressing line of the word space equal to the bits of the block space address+x low bits. Therefore, in this case, the block space address is the high bit portion of the word space address. In a preferred embodiment of the present invention, the block size may be defined as an integer multiple of the capacity of a region (that is, window place), or the capacity of a window place is defined as an integer multiple of the block capacity.

Figure 4:
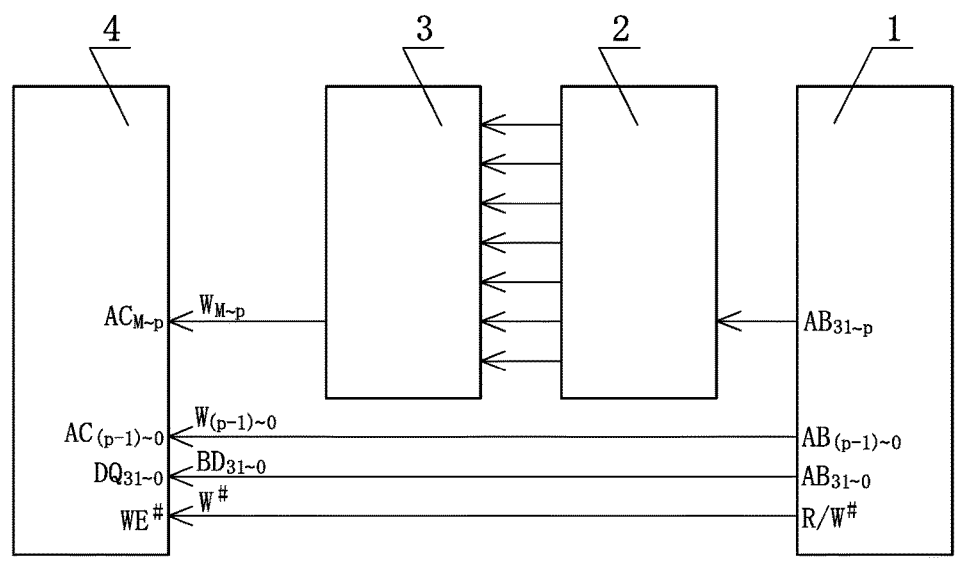
FIG. 4 is a schematic structural view showing the connection in a computer system according to a preferred embodiment of the present invention.

In a preferred embodiment of the present invention as shown in FIG. 4, the circuit structure of the above computer system is specifically described.

In a preferred embodiment of the present invention, the reference numerals used in embodiments shown in FIG. 4 and following drawings are described.

In the embodiment, the overall structure of the system includes a CPU1, a memory address decoder array 2, a shift latch set 3, and a dual space storage 4. The principle is as shown in FIG. 4. The CPU1 is a specific embodiment of the processor 100. The memory address decoder array 2 is a specific embodiment of the first decoder unit 302. The shift latch set 3 is a specific embodiment of multiple latch units 301. The dual space storage 4 is a specific embodiment of the storage 200.

For ease of illustration, in various preferred embodiments of the present invention, a CPU of IA32 architecture is taken as an example; however, the protection scope of the present invention is not limited thereto. In other preferred embodiments of the present invention, specific connection lines may be correspondingly changed with varying architecture types of CPU. However, the change may be made by those skilled in the art based on the technical solution of the present invention without creative efforts, which is embraced in the protection scope of the present invention.

In a preferred embodiment of the present invention, the CPU of IA32 architecture has a data bus with a width of 32 bits and represented by data bus $DB_{31-0}$; an address bus with a width of 32 bits and represented by address bus $AB_{31-0}$; and a read/write control line represented by read/write control line R/W# (in a preferred embodiment of the present invention, the superscript "#" indicates "negation" or "active low").

The memory read/write control line R/W# of CPU1 is connected by a word space read/write control line W# to a word space read/write control line WE# of the dual space storage 4. The data bus $DB_{31-0}$ of CPU1 is correspondingly connected by word data transfer lines $DB_{31-0}$ to data lines $DQ_{31-0}$ of the dual space storage 4. The address bus $AB_{31-0}$ of CPU1 includes two parts, where low p bit address lines $AB_{(p-1)-0}$ are correspondingly connected by low p bit word space word addressing lines $W_{(p-1)-0}$ to low p bit word space address lines $AC_{(p-1)-0}$ of the dual space storage 4, and the remaining high-bit address lines $AB_{31-p}$ are correspondingly connected to the memory address decoder array 2. Each output line of the memory address decoder array 2 is respectively connected to an output control of one latch in the shift latch set 3. The homonymous data output line of all the shift latches is connected in parallel to high-bit word space addressing lines $W_{M-p}$, wherein M-p equals to the bits of the shift latches.

The working principle underlying the embodiments shown in FIG. 4 is as follows. A 32-bit memory address $Ad_{31-0}$ is given when CPU1 accesses the internal memory. The high 32-p bits $Ad_{31-p}$ of the memory address enter the memory address decoder array 2 through the high-bit address lines $AB_{31-p}$; after the memory address decoder array 2 decodes the high 32-p bits $Ad_{31-p}$ of the memory address, the memory address decoder array 2 has only one output pin at active level. The output pin at active level controls the output from one of the shift latch set 3 to be valid. The valid latch sends its value to the high-bit word space addressing lines $W_{M-p}$; and the low p bit portions $Ad_{(p-1)-0}$ of the memory address are sent by the low p bit address lines $AB_{(p-1)-0}$ to the low-bit word space addressing lines $W_{(p-1)-0}$. Then, the word space addressing lines $W_{M-0}$ address the word space of the dual space storage 4. Under control of a valid signal from the word space read/write control line W#, the addressed storage unit in the word space is transferred to CPU1 by the word data transfer lines $DB_{31-0}$.

It can be known from the working principle that in the embodiment shown in FIG. 4, a segment of continuous and non-partitionable memory address designated to a local range on the word space is the value of $Ad_{(p-1)-0}$. Therefore, the address in each mapping window in the system is $Ad_{(p-1)-0}$, and the window width is $2^p$. $2^{(31-p)}$ shift latches exist in total, and each shift latch corresponding to one mapping window. Because each shift latch has M-p bits, the word space is $2^{M+1}$ bytes, which is $2^{M-31}$ times larger than the internal memory space, and is divided into $2^{(M-P)}$ window place.

With reference to the embodiment shown in FIG. 4, the shift principle is briefly described. It is assumed that the total number of the memory address lines of CPU1 is N+1, and the total number of the word space address lines of the dual space storage 4 is M+1. A mapping window is established with low p bit memory address lines, and the window width is $2^p$. The remaining high n bit memory address lines form the shift latch selection line, and $2^n$ shift latches exist, where n=N+1−p. The data that is output from the shift latch is sent to high m bits of the word space address lines, and the word space is divided into $2^m$ window places, where m>n, and m=M+1−p. After CPU1 outputs a memory address including N+1 bits, the high n bits select one shift latch in the shift latch set 3 by the memory address decoder array 2, and a mapping window corresponding to the selected shift latch is referred to as a current mapping window. The shift latch outputs high m bits of the word space address of the dual space storage 4, and the value of m gives a current window place where the current mapping window is positioned. CPU1 accesses the word data on the current window place via the current mapping window. If CPU1 accesses a continuous memory address, the value of n is unchanged, the selected shift latch is unchanged, and the current mapping window is unchanged, and thus CPU1 accesses a continuous address in the same window place. If there is a hop in the memory address accessed by CPU1 and the value of n is caused to change, another shift latch in the shift latch set 3 is selected by the memory address decoder array 2, and the current mapping window is a mapping window corresponding to the later selected latch instead. The m-bit data that is output from the latch positions the current mapping window onto another window place, that is, the current mapping window is shifted to a new window place.

When the latched value in a shift latch is updated, the mapping window corresponding to the shift latch is directed to a window place represented by the new value. Therefore, the shift latch is also referred to as a shift vector. Hereafter, once the high n bits of the memory address sent from CPU1 selects the shift latch; the current mapping window is automatically shifted to the window place. By changing the value stored in the shift latch, the window place where the mapping window corresponding to the shift latch is positioned may be changed. For ease of changing the shift latch by CPU1, in a preferred embodiment, a data input of the shift latch may be arranged on a high-bit window place of the word space of the dual space storage 4. In this case, the shift latch has a structure characterized in that the data input of the shift latch resides in the word space of the dual space storage 4, and a data output is a high-bit address line of the word space of the dual space storage 4, for addressing the word space of the dual space storage 4. In a preferred embodiment, the data input of the shift latch is arranged on a window place that is not visible to a user in the word space of the dual space storage 4, to protect the security of the shift latch.

Figure 5:
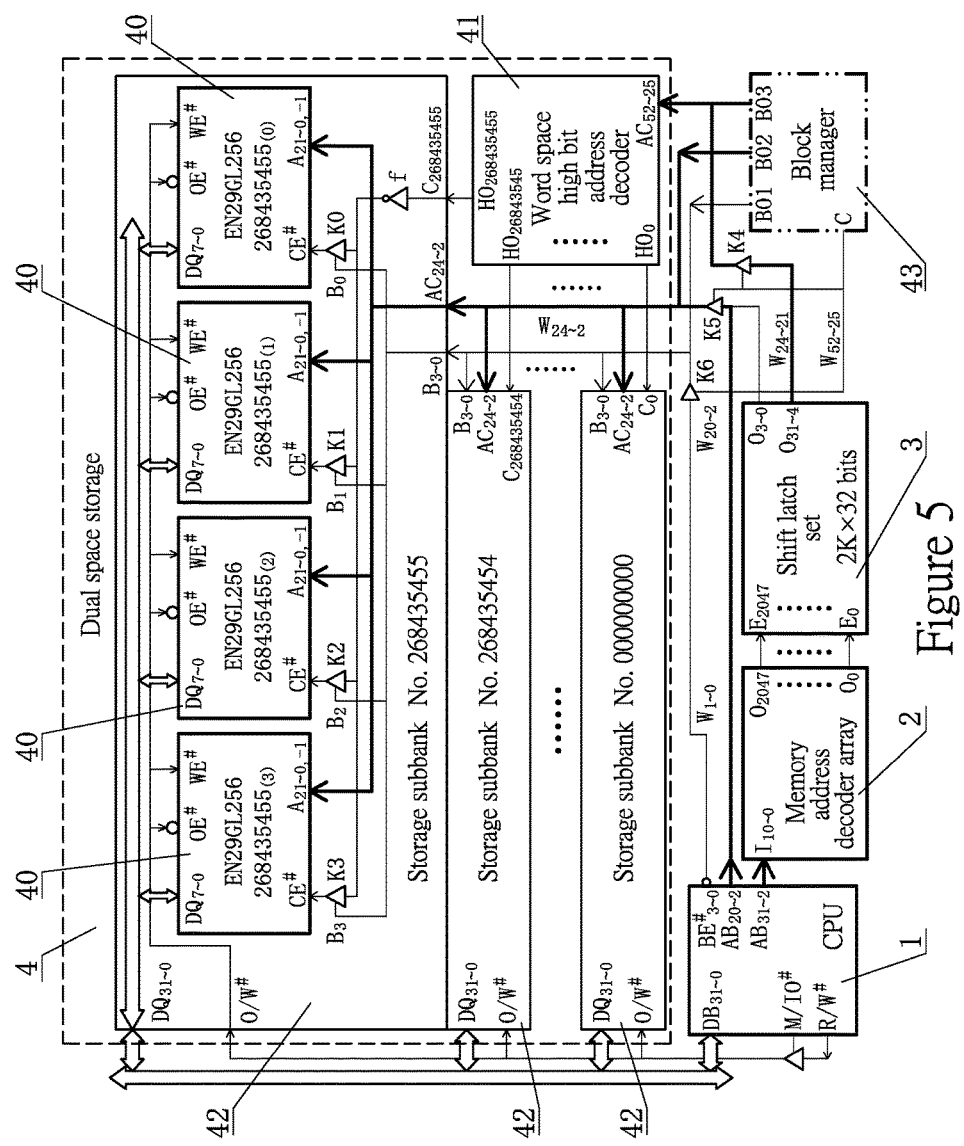
FIG. 5 is a schematic structural view of a storage according to a preferred embodiment of the present invention.

In a preferred embodiment of the present invention, as shown in FIG. 5, a dashed box gives a dual space storage structure constructed with 1073741824 Nor Flash-type RAM chips EN29GL256 (referred to as storage chip 40 hereinafter). It should be noted that the particular choices of the type and number of the chip are exemplary, and the protection scope of the present invention is not limited thereto. The dual space storage structure includes a word space high-bit address decoder 41 (a specific embodiment of the second decoder unit 303) and 268435456 storage subbanks 42. The storage subbanks 42 are numbered from No. 0000000 to No. 268435455, and each storage subbank 42 includes 4 storage chips 40, as shown by the storage subbank 42 identified by No. 268435455 in FIG. 5.

A preferred method for forming the data lines $DQ_{31-0}$ of the dual space storage 4 is as follows. A chip select $CE^{\#}$ of each storage chip 40 respectively passes a tri-state gate K0, a tri-state gate K1, a tri-state gate K2, and a tri-state gate K3, then is connected in parallel, and passes a Not-gate f, to form a chip select $C_i$ (i=0, 1, . . . , 268435455) of the storage subbank 42 where the storage chips reside. The tri-state gates are controlled respectively by a signal line $B_3$, a signal line $B_2$, a signal line $B_1$, and a signal line $B_0$. Therefore, the signal line $B_3$, the signal line $B_2$, the signal line $B_1$, and the signal line $B_0$ form a byte selection line $B_{3-0}$ of a data line $DQ_{31-0}$ of the storage subbank 42. The byte selection lines $B_{3-0}$ of all the storage subbanks 42 are connected together, inverted, and then connected to the pins $BE^{\#}_{3-0}$ of CPU1. Therefore, the data line $DQ_{7-0}$ of the storage chip 40 under control of the signal line $B_0$ is connected to the lowest 8 bit data line $DB_{7-0}$ of CPU1, the data line $DQ_{7-0}$ of the storage chip 40 under control of the signal line $B_1$ is connected to the data line $DB_{15-8}$ of CPU1, the data line $DQ_{7-0}$ of the storage chip 40 under control of the signal line $B_2$ is connected to the data line $DB_{23-16}$ of CPU1, and the data line $DQ_{7-0}$ of the storage chip 40 under control of the signal line $B_3$ is connected to the data line $DB_{31-24}$ of CPU1. Therefore, the 8 bit data lines $DQ_{7-0}$ of the 4 storage chips 40 collectively form the 32 bit data lines $DQ_{31-0}$ of the storage subbank 42.

A preferred method for forming the word space address lines $AC_{M-0}$ (M is bits of the word space address-1) of the dual space storage 4 is as follows. On-chip address pins $A_{21-0, -1}$ of the 4 storage chips 40 are correspondingly connected in parallel, to form word space address lines $AC_{24-2}$ of the storage subbank 42 where the storage chips reside. Because the byte selection line $B_{3-0}$ is logically an output line after decoding the word space address line $AC_1$ and word space address line $AC_0$, logically 25 word space address lines $AC_{24-0}$ of the storage subbank 42 are formed by the word space address lines $AC_{24-2}$ and the byte selection line $B_{3-0}$. The chip selects $CE^{\#}$ of the 4 storage chips 40 respectively pass the tri-state gate K0, the tri-state gate K1, the tri-state gate K2, and the tri-state gate K3, then are connected in parallel, and passes the Not-gate f, to form a chip select $C_i$ (i=0, 1, . . . , 268435455) of the storage subbank 42 where the storage chips reside. The chip selects $C_{268435455-0}$ of the storage subbanks 42 are connected to pins of the same subscript number in the output pins of the word space high-bit address decoders 41. Therefore, the inputs of the word space high-bit address decoders 41 are the high-bit portion of the word address of the dual space storage 4, which are labeled as $AC_{52-25}$ in FIG. 5. Accordingly, the address line pins of the dual space storage are $AC_{52-25}$, $AC_{24-2}$, and $B_{3-0}$, and 53 address line pins exist logically. Therefore, the dual space storage has 8P bytes.

A preferred method for forming the word space addressing lines $W_{M-0}$ is as follows. The pins $BE^{\#}_{3-0}$ of CPU1 function as the lowest 2 bits $W_1$ and $W_0$ of the word space addressing line after "negation", and thus the 4 lines are logically the lowest 2 bits of the word space addressing lines. The memory address lines $AB_{20-2}$ of CPU1 are directly used as the word space addressing lines $W_{20-2}$. High 11 bit address lines $AB_{31-21}$ of CPU1 are connected to addressing ports $I_{10-0}$ of the memory address decoder array 2. 2048 output lines $O_{2047-0}$ of the memory address decoder array 2 are respectively connected to output enable ports $E_{2047-0}$ of a latch of the same subscript in the shift latch set 3, for making a selection among 2K shift vectors. The shift latch selected by the output lines $O_{2047-0}$ outputs the 32-bit value stored therein to output pins $O_{31-0}$ of the shift latch set 3, the output from the output pins $O_{31-0}$ forms high-bit word space addressing lines $W_{52-21}$. Therefore, 53 bits in total of the word space addressing lines $W_{52-2}$ together with the pins $BE^{\#}_{3-0}$ of CPU1 after negation logically forms the word space addressing lines $W_{52-0}$. Therefore, the word space has an address of 8P bytes.

A preferred method for connecting the word space addressing line $W_{M-0}$ and the word space address lines $AC_{M-0}$ of the dual space storage is as follows. In FIG. 5, the storage subbank 42 has 25 address lines, and thus the lowest 25 bit word space addressing lines formed by $W_{24-2}$ and the pins $BE^{\#}_{3-0}$ of CPU1 after negation pass a tri-state gate K5 and a tri-state gate K6, and then are connected to 25 address lines formed by the word space address lines $AC_{24-2}$ and the byte selection lines $B_{3-0}$ of the storage subbank 42. High 28 bit word space addressing lines $W_{52-25}$ pass a tri-state gate K4, and then connected to the inputs $AC_{52-25}$ of the word space high-bit address decoder 41, and outputs $HO_{268435455-0}$ of the word space high-bit address decoder 41 are connected respectively to a chip select $C_i$ (i=0, 1, . . . , 268435455) of a storage subbank 42, where during connection, the number of the storage subbank 42 is the same as the subscript number of the outputs of the word space high-bit address decoder 41. Therefore, addressing the storage subbanks 42 by the word space addressing lines $W_{52-25}$ realizes the selection of the storage subbanks 42, the byte selection lines $B_{3-0}$ address the chip 40 in the storage subbank 42, and the word space addressing lines $W_{24-2}$ address the byte storage unit in the chip 40.

A preferred method for controlling the access mode of the word space in the dual space storage 4 is as follows. In an embodiment as shown in FIG. 5, an output control $OE^{\#}$ of each storage chip 40 after negation is connected in parallel with a write control $WE^{\#}$ to a read/write control $O/W^{\#}$ of the storage subbank 42 where they reside. The read/write control $O/W^{\#}$ of the storage subbank 42 passes a tri-state gate K7, and then is connected to a read/write control $R/W^{\#}$ of CPU1, where the tri-state gate K7 is under control of an access control pin $M/IO^{\#}$ of CPU1, and conducted only when the access control pin $M/IO^{\#}$ is at a high level. Further, because the access control pin $M/IO^{\#}$ outputs a high level only when CPU1 accesses the internal memory, the access to the word space by CPU1 can only be realized by way of memory access. When CPU1 gives an instruction of reading the memory, the access control pin $M/IO^{\#}$ and the memory read/write control line $R/W^{\#}$ are both at a high level, and the read/write control O/W# of the storage subbank 42 is at a high level, such that the word space write control line $WE^{\#}$ of each storage chip 40 of the storage subbank 42 is in valid. After the read/write control O/W# of the storage subbank 42 is inverted, the output control OE# of the storage chip 40 is valid, such that the storage chip 40 outputs data to CPU1. Likewise, when CPU1 gives an instruction of writing in the memory, the access control pin M/IO# is at a high level, and the memory read/write control line R/W# is at a low level, so the storage chip 40 receives data sent from CPU1.

A preferred process for accessing the word space of the dual space storage 4 is as follows. Access to the word space is equivalent to CPU1 accessing the internal memory. In this case, a block manager 43 does not work, an output C of the block manager 43 is at a low level, other outputs of the block manager 43 are all in an off state, the tri-state gate K4, the tri-state gate K5, and the tri-state gate K6 are all in an on state, and the value of the word space address lines is from the output of the memory address bus of CPU1 and the shift latch. In this case, the shift system works. Specifically, when CPU1 accesses the internal memory, the memory address bus $AB_{31\text{-}2}$ and the pins $BE^{\#}_{3\text{-}0}$ send a 32-bit memory address, the low 21 bit memory address bus $AB_{20\text{-}2}$ and $BE^{\#}_{3\text{-}0}$ are negated, pass the open tri-state gate K5 and tri-state gate K6, and connected to each storage subbank 42, to form a low 21-bit address $Ad_{20\text{-}0}$ of the dual space storage 4 (formed by the word space addressing lines $AC_{20\text{-}2}$ and the byte selection lines $B_{3\text{-}0}$ of the dual space storage 4), and realize the addressing of bytes in every 2M address range in the word space of the dual space storage 4, thus forming a mapping window of the system as shown in FIG. 5. The high 11 bit address bus $AB_{31\text{-}21}$ of CPU1 is connected to the addressing ports $I_{10\text{-}0}$ of the memory address decoder array 2, passes the memory address decoder array 2, and selects one in the 2K latches in the shift latch set 3, that is, selects a shift vector. The shift latch selected by the code value of the high 11 bit memory addresses $AB_{31\text{-}21}$ generated by CPU1 outputs the 32-bit value stored therein via the output pins $O_{31\text{-}0}$ of the shift latch set 3 to the high bit word space addressing lines $W_{52\text{-}21}$. The word space addressing lines $W_{24\text{-}21}$ pass the open tri-state gate K5, and are connected to the address lines $AC_{24\text{-}21}$ of each storage subbank 42, to select one of the 16 window places inside the storage subbank 42. The word space addressing lines $W_{52\text{-}25}$ pass the open tri-state gate K6, and are connected to the inputs $AC_{52\text{-}25}$ of the word space high-bit address decoders 41, to select a storage subbank 42. Therefore, in the selection of the window place of the dual space storage 4 by the word space addressing lines $W_{52\text{-}21}$, a total of $2^{32}$ (4G=4294967296) window places exist, and the value is the high 32 bits of the first address of the window position.

In a preferred embodiment of the present invention, the following situation needs to be considered.

Because some programs and data in the computer system are critical to the security of the whole system, for example, interrupt vector table, recordings in task segment, and shift latch set and so on, once the programs and data are objectively changed by a user maliciously or due to an error operation, the data is caused to be stolen or damaged, or the system crash is caused. Therefore, the computer system always sets the programs and data as being non-modifiable by or non-visible to the user. Also, some data has positions in the internal memory that are well defined by the hardware of CPU, so the data has to be positioned as required, or the system cannot work normally. The data at these positions is also non-modifiable by the user.

Further, in a preferred embodiment of the present invention, the shift latch set 3 is used to shift the mapping window. However, if the user can directly shift the mapping window at will, it will cause fatal danger to the security of the whole software system. Therefore, any mapping window is not permitted to be shifted by any user application program in any case, including not shifting the mapping window of users themselves. Rather, a request of accessing the word space of the dual space storage 4 is sent to the operating system, then the operating system sends a mapping window request to underlying control software in response to the request of the user, and the underlying control software implements a mapping window shift operation for the user. The way to ensure that the user cannot shift the mapping window is not permitting the user to access the shift latch set. One of the approaches to this object is to position the shift latch set at a particular location in the word space of the dual space storage 4 that can merely be accessed by dedicated underlying control software of the system manufacturer, and the operation for assigning a value to this region is strictly restricted. Moreover, if a shift latch corresponding to software that is critical to the system safety and automatic reply is set as being non-modifiable, or even the latches of these mapping windows are non-modifiable latches instead, the underlying security of the system can be ensured in any case. The non-modifiable latch is a specific embodiment of the first-class latch.

When the latched content in a shift latch is changed, the shift latch is directed to a new position in the word space of the dual space storage 4, and correspondingly the mapping window is positioned on a window place with the new position as a window position. A current state of the window place is known as open window in a preferred embodiment of the present invention, and a current state of a window place that no shift latch is directed to is known as closed window in a preferred embodiment of the present invention. If the latched value in a shift latch is set as being non-modifiable, correspondingly, the mapping window becomes a non-movable mapping window, and the shift latch is persistently directed to a particular window place. Then, such a window place is persistently in an open window state, and becomes a non-closable window. In a preferred embodiment of the present invention, CPU1 can access the data and program in corresponding non-closable window through the non-movable mapping window in any case, which creates conditions for automatic restoration of the system.

Because the position of the non-closable window is determined by the system manufacturer, if the latched value of the shift latch residing therein cannot be read, the position of the corresponding non-closable window is not visible to the user of software, and even to the operating system. Therefore, the access to the non-closable window by the user or the operating system can only be accomplished by requesting the underlying control software provided by the system manufacturer. This enhances the system security to an extent.

Figure 3:
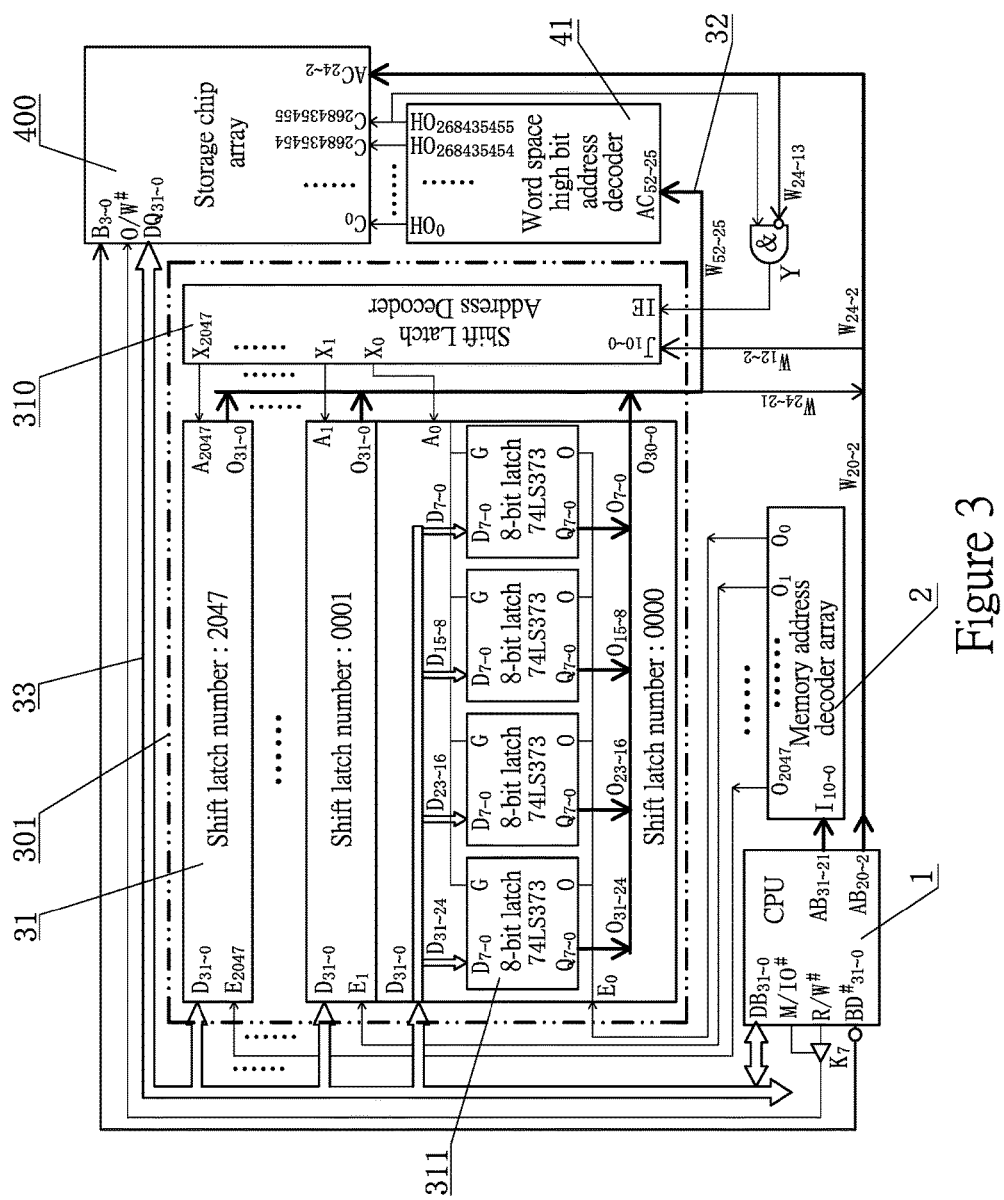
FIG. 3 is a schematic structural view of a latch unit according to a preferred embodiment of the present invention.

An embodiment shown in FIG. 3 gives a preferred implementation of a configuration of a shift latch set 3. The shift latch set 3 is a core to implement the shift technology, and is a latch array having a structure as shown in FIG. 3. The embodiment shown in the figure is essentially composed of a shift latch set chip array 301 consisting of 8192 8-bit latch chips 74LS373 and a shift latch address decoder 310, where each 4 chips 74LS373 constitute a 32-bit shift latch 31 numbered from 0000 to 2047, see the structure shown in double dashed box in FIG. 3. The storage chip array 400 in the figure is an embodiment of a set of storage subbanks 42.

In a j-th shift latch 31 (j=0, 1, . . . , 2047), output controls O of 4 latch chips 311 are connected in parallel, to form a output control $E_j$ of the shift latch 31. Data outputs $Q_{7\text{-}0}$ of the 4 latch chips 311 are sequentially aligned to form data outputs $O_{31-0}$ of the shift latch 31. Write controls G of the 4 latch chips 311 are connected in parallel, to form a write control $A_j$ of the shift latch 31. Data write ports $D_{7-0}$ of the 4 latch chips 311 are sequentially aligned to form data write ports $D_{31-0}$ of the shift latch 31.

The data outputs $O_{31-0}$ of the same subscript of all the shift latches 31 are connected together in parallel, to form a data output line 32 of the shift latch set 3. The data output line 32 further forms high 32 bits $W_{52-21}$ of the word space address line. The output control $E_j$ of the j-th shift latch 31 is under control of an output pin $O_j$ of the memory address decoder array 2. The data write ports $D_{31-0}$ of the same subscript of all the shift latches 31 are connected together in parallel, to form a data write line 33 of the shift latch set 3. The data write line 33 is further connected in parallel to the data bus $DB_{31-0}$ of CPU1. The write control $A_j$ of the j-th shift latch 31 is under control of an output pin $X_j$ of the shift latch address decoder 310. Inputs $J_{10-0}$ of the shift latch address decoder 310 are connected to word space address lines $W_{12-2}$, A chip select IE of the shift latch address decoder 310 is connected to an output of an AND gate Y, and an input of the AND gate Y is word space address lines $W_{24-13}$ after negation and output $HO_{268435455}$ of the word space high bit address decoders 41.

Based on the connection between the inputs $J_{10-0}$ of the shift latch address decoder 310 and the chip select IE, the process of writing data (shifting the vector magnitude) in the j-th shift latch 31 includes the following. When the word space address lines $W_{52-25}$ are all 1 and $W_{24-13}$ are all 0, the AND gate Y outputs 1. In this case, the shift latch address decoder 310 is selected. The shift latch address decoder 310 decodes contents that are input via the word space address lines $W_{12-2}$ connected to the input $J_{10-0}$, and gates an $X_j$ for output according to the value of the word space address lines $W_{12-2}$, where the $X_j$ controls the data write control $A_j$ of the j-th shift latch 31 to be valid. Therefore, CPU1 can write the shift vector magnitude via the data bus $DB_{31-0}$ in the j-th shift latch 31. It can be known that the data write port of the shift latch 31 is positioned in an upper region of the word space of the dual space storage 4, and the data output thereof generates high-bit address of the word space. This differs from the general feature of use of the latch.

In a preferred embodiment of the present invention, the non-closable window is further described as follows.

A non-closable window may be set and a data sheet is positioned in the window. In a preferred embodiment of the present invention, the mapping window No. 2047 may be set to be a non-movable mapping window, that is, a window place where it resides is set to be a non-closable window, and the shift latch set 3 is positioned in the non-closable window.

Figure 8A:
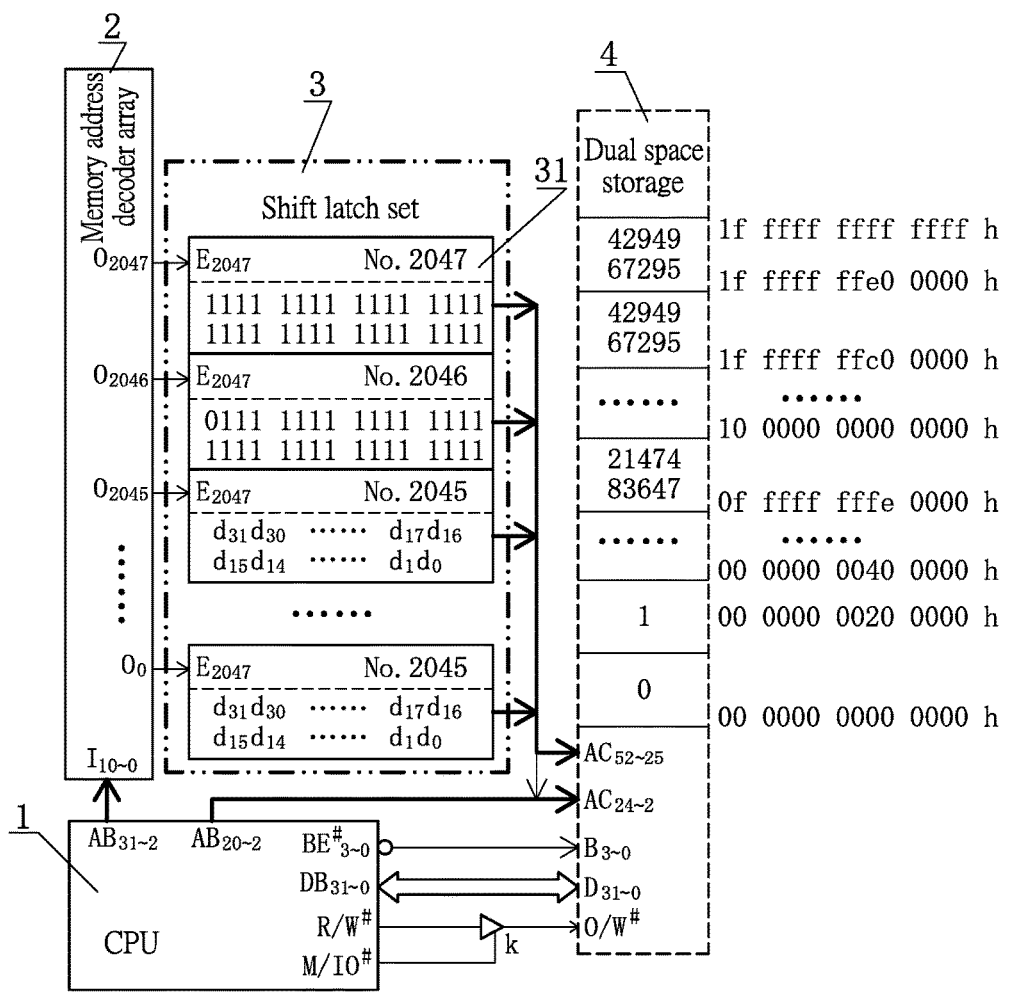
FIGS. 8 (A) to 8 (C) are schematic views showing the setting and use of a non-closable window according to a preferred embodiment of the present invention.
Figure 8B:
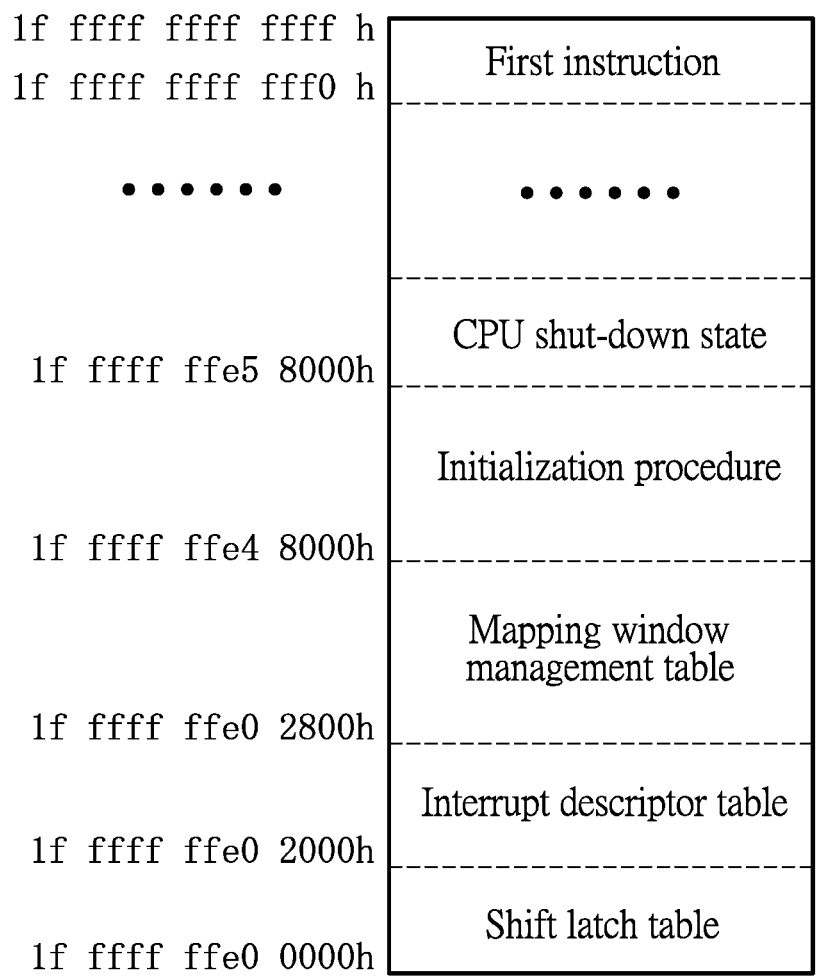
Figure 8C:
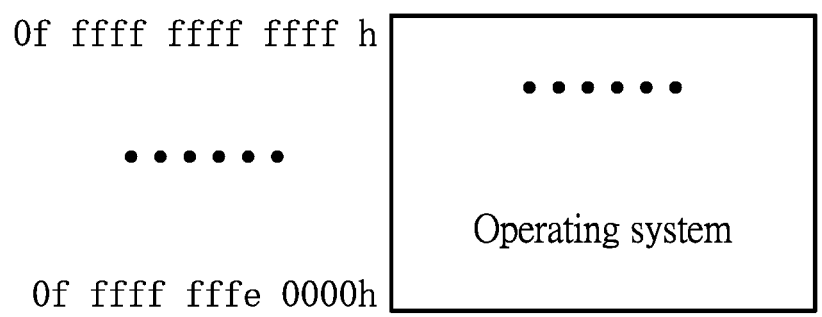

In a preferred embodiment of the present invention, as shown in FIGS. 8 (A) to 8 (C), if the latched value in the shift latch No. 2047 is set to 0ffff ffffh and be non-modifiable, then the mapping window No. 2047 is set to be a non-movable mapping window. After the shift latch No. 2047 sends the value 0ffff ffffh onto the word space addressing line $W_{52-25}$, the position 1f ffff ffe0 0000h is addressed in the word space of the dual space storage 4, and then the mapping window No. 2047 is located at the position 1f ffff ffe0 0000h in the word space of the dual space storage, that is, the window place No. 4294967295, as shown in the table in the embodiment shown in FIG. 6.

When the value in a shift latch 31 is set as being non-modifiable, the corresponding mapping window becomes a non-shiftable window, the window is fixed at a window place designated by the value in the shift latch 31, and the window place becomes a non-closable window. The non-shiftable window is critical to the operation of the system. The main usages include two kinds. One is to accomplish the access to the memory address designated by the hardware, for example, the memory address accessed under the first instruction after the system is reset. The other is to accomplish instant access to commonly used programs or data, for example, the access to the portion of the operating system that is resident in the internal memory. The embodiment in FIGS. 8 (A) to 8 (C) provides the setting and example of a non-closable window for a CPU system of IA32 architecture. For a CPU of IA32 architecture (for example, Pentium family), after the system is reset, an instruction at memory address 0fffffff0H is implemented, where the position is an entry to initialization program in real-address mode of the system. Because the outputs from the high bit address lines $AB_{31-21}$ of the address are all 1, the shift latch 31 No. 2047 is selected, and the mapping window No. 2047 is a current mapping window. Because the outputs from the low bits address lines $AB_{20-0}$ of the address are 1ffff0H, the first instruction has to be located at an address offset by 1ffff0H in the mapping window No. 2047. Because this address is an entry to initialization program in real-address mode of the system, the corresponding window place must be able to be accessed at power up, which requires the mapping window No. 2047 to locate in the window place before the system is powered up. The approach to meet the three requirements is to set a non-modifiable value for the shift latch No. 2047, such that the mapping window No. 2047 is a non-shiftable window, and the corresponding window place is a non-closable window. As shown in FIG. 8(A), the value in the shift latch 31 No. 2047 is set to 0ffffffffH and is non-modifiable, then the mapping window No. 2047 is located in the window place No. 4294967295. The first address of the window place in the word space is 1f ffff ffe0 0000H, and the word space address of the 1ffff0H offset address in the window is 1f ffff ffe0 0000H+1f ffff0H=1f ffff ffff fff0H. The first instruction to be implemented after CPU1 being reset is positioned at this address, see FIG. 8 (B). Because the first instruction is arranged at the uppermost end of the word space in FIG. 8 (B), the initiation program can only be placed at other positions, and at position 1f ffff ffe4 8000h in FIG. 8 (B), which is offset in the mapping window No. 2047 by 1fffff ffe48000h-1fffffffe00000h=48000h. Therefore, the first instruction is a relative jump instruction with 48000h as a jump distance.

In the embodiment shown in FIG. 8 (B), the operation of implementing the first instruction at the memory address 0ffff0h after the system being reset is guided by the shift system to implement an instruction at 1ffffffffffff0h in the word space, which transfers CPU1 to a start position of the initiation program in real-address mode at an address offset by 48000h in the current mapping window. After that, CPU1 runs the initiation program. From the perspective of CPU1, the whole process has no difference from the prior art.

Data structures such as interrupt vector table, file management table, shift vector table, and mapping window management table are the basis of system operation, and are frequently accessed. Furthermore, fundamental operations such as keyboard scan, display management, and file calling are also program modules that are frequently executed. The access speed to these commonly used data and program modules will seriously affect the operating efficiency of and the direct perception for the system. In an existing computer system, the commonly used data structures and program modules are placed in the internal memory, to ensure a high access speed. However, the data and programs occupy a large space in the internal memory, causing reduced internal memory available to the user, and causing increased internal memory space of the system, both of which reduce the operating speed of the system and deteriorate the direct perception of the user. However, this problem can be easily solved by using the non-shiftable window. This technology is described with the arrangement of an interrupt vector table, a shift vector table, and the operating system below.

In the embodiment shown in FIG. 8 (B), recorders and programs such as interrupt vector table, shift latch set (shift vector table), mapping window management table, initialization program, CPU shut-down state, and the first instruction are arranged in the non-closable window No. 4294967295. The position of the first instruction should be in correspondence with the initial state value of CPU1, and the positions of the others are set by the motherboard manufacturer. As shown in FIG. 8(B), the shift latch set 3 is set at the start 8 KB position of 1f ffff ffe0 0000h, and the instruction assigning 1234h to the shift latch 31 No. 0005 is mov [ffe0 0014], 1234h.

When the system is powered off, all the states of CPU1 before shut down are saved in "positions of CPU shut-down state". At next power on, the initialization program restores the state of CPU1 from the content at the position, and the system "immediately" continues the work before power off, which is so fast that the user cannot feel the waiting time.

In a preferred embodiment of the present invention, on basis of the above steps, the instruction for assigning a value to the shift latch by the system is assigning a value to ffe0 0000h to ffe0 1ffh of the internal memory space, a 32-bit data movement instruction may be used, and the assigned address is an integral multiple of 4. For example, in a preferred embodiment of the present invention, for a CPU of IA32 architecture, the instruction for assigning 1234h to the shift latch No. 0005 is: mov [ffe0 0014], 1234h, that is, shift the mapping window No. 5 to the window place No. 1234h, where the first address of the window place is 00 00002 4680 0000h. It is difficult for the user to interfere the shift latch set as long as the manufacturer keeps any of the number of the shift latch corresponding to the non-closable window, the latched value in the shift latch, the offset address of the shift latch set, and the actual structure of the shift latch set secret to the user. The underlying control software receives the request of changing the shift latch from the user or the operating system, and then checks the security of the request, and changes the shift latch after the security check is passed, thereby increasing the system security.

In a preferred embodiment of the present invention, if the block space managed by the operating system is set to be below the window place No. 4294967295, then an ordinary user cannot change the shift latch by means of storing a file into a storage unit where the shift latch set resides by the operating system in the block space.

In a preferred embodiment of the present invention, the window places are allocated on the dual space storage by the system in advance. From the perspective of managing the window places, in a preferred embodiment of the present invention, the attributes of each window place should be noted in the window place division and management table as shown in FIG. 6, for example, whether the window place is in an open state and which mapping window is located in the window place if yes, and the name of the file stored in the window place, etc. In the window place division and management table as shown in FIG. 6, the management information is indicated merely by "mapping window number", "file name", and "window place following the file". The value of the "mapping window number" is the number of the mapping window currently positioned on corresponding window place. If the value is ffffh, it is indicated that the current state of the window place is closed. The "file name" is the name of the file stored in the window place by a file management system on the block space of the dual space storage. The column "window place following the file" gives the number of the window place where an adjacent part following the file on the corresponding window place resides. Apparently, in a preferred embodiment of the present invention, the "file name" maps the position in the block space of the file stored in the dual space storage to the word space, and the "mapping window number" maps the position of the file in the word space to the internal memory space, whereupon CPU can directly access the storage unit where the file resides through the mapping window.

In a preferred embodiment of the present invention, the window place management table is used by the operating system. When the operating system stores a file in the block space, the "file name" and "window place following the file" in the table are filled. When the operating system calls a file for operation, an available mapping window is located on the window place, and corresponding "mapping window number" is filled. Therefore, in a preferred embodiment of the present invention, the window place division and management table are consistent with the storage block management table of the conventional external storage.

In a preferred embodiment of the present invention, if only one window width exists in the system, and the size equals to the block capacity, then the window place management table may be used as a storage block management table, and thus it may be included in the file management system of the operating system.

For a non-closable window given in a preferred embodiment of the present invention, if the non-closable window is intended to be made non-visible to the operating system, the window place may be hidden in the window place division and management table. In a preferred embodiment of the present invention, for example, in the embodiment as shown in FIG. 6, the window places corresponding to the address above 10 0000 0000 0000h are hidden. The operating system cannot use the block space corresponding to the window places hidden in the embodiment as shown in FIG. 6. However, the access to the word space of the window places by CPU through the mapping windows is not affected. This provides conditions for hiding important non-closable window. No storage chips need to be mounted in the portions in the hidden window place space that are not used by the word space, so as to reduce the cost.

To effectively manage the mapping window, in a preferred embodiment of the present invention, the computer system may create a mapping window management table for recording the use of the mapping window (for example, current window place occupied by the mapping window of each shift latch, idle time of a mapping window, whether the content of a corresponding window place is permitted to write, file name, whether the file is executable, and position of adjacent content following the file, etc). In a preferred embodiment of the present invention, for example, as shown in FIG. 7, the establishment and use of a mapping window management table are described with mapping window first address, mapping window number, movability, window place number, file name, data type, share permission, idle time and so on as examples. The "file name" indicates the file to which the data (that is, current data in the mapping window) in the window place where the mapping window is located belongs. The "data type" indicates the read, write and executable characteristics (that is, operational attributes) of current data in the mapping window. The "share permission" indicates the share condition of current data in the mapping window. The "movability" indicates whether the mapping window is movable (namely, "whether it can be reselected" in a preferred embodiment of the present invention), that is, whether the corresponding shift latch can be written in. The "idle time" records the duration from the previous use of the mapping window to now, for determining whether the mapping window is suitable for being allocated to a new requester for use.

For the sake of system security, in a preferred embodiment of the present invention, the mapping window management table is to be used by the underlying control software provided by the manufacturer, and is non-visible to the user (and even the operating system). Specifically, when the underlying control software receives a request of allocating a mapping window, the mapping window type required, the window place number, the file name on the window position, the data type of the file, whether write is permitted, whether share is permitted, and others need to be acquired. The underlying control software looks up the idle time column in the mapping window management table, and selects a mapping window according to a set algorithm. For example, in the table in the embodiment shown in FIG. 7, the mapping window No. j is selected. The underlying control software changes the content of the row j in the mapping window management table according to the received request information, and assigns the window place number carried in this mapping window request to the shift latch No. j by using a corresponding shift instruction, whereby the mapping window No. j is shifted onto a designated window place. Then, the system feeds the mapping window number j back to the requester. After obtaining the number of the mapping window, the requester places it in the "mapping window number" column under the window place row in the window place division and management table. In this manner, the process for positioning a mapping window onto a designated window place in the word space of the dual space storage is completed. In a preferred embodiment of the present invention, the above process is similar to a conventional process in which the data on a window place is copied to the internal memory, and then the memory address of the copy is recorded in a memory address relocation management table.

On basis of the above technical solutions, the changes made to the physical/logical connection relation of each elements in the system and substitutions with equivalent elements made in the process of the read and write operation are all contemplated in the protection scope of the present invention.

While the present invention has been described in detail with reference to the preferred embodiments; however, the implementations and protection scope of the present invention are not limited thereto. It should be appreciated by those skilled in the art that the solution obtained by making equivalent replacements and obvious changes to the specification and drawings of the present invention are all embraced in the protection scope of the present invention.

What is claimed is:

1. A computer system, comprising a processor and a storage, wherein the storage comprises multiple storage units and is divided into multiple storage blocks of the same size, each storage unit has a word address and is accessed via a word address line, and each storage block has a block address and is accessed via a block address line, the computer system further comprising:

an addressing assembly, connected respectively to high bits of a memory address line of the processor and high bits of the word address line of the storage, and used to convert, in a preset continuous or discrete range on the storage, high bits of a memory address formed by the processor into high bits of a corresponding word address of the storage and output the high bits to the storage, wherein low bits of the memory address line of the processor are connected to low bits of the word address line of the storage;

the preset range is smaller than or equal to an addressing range of the memory address line of the processor; and the processor changes the storage units of the storage covered by the preset range by changing the preset range; and wherein the addressing assembly comprises multiple latch units, the outputs of each latch unit are connected to the high bits of the word address line of the storage, each latch unit stores the high bits of the word address of one storage unit, the storage units of the storage covered by the high bits of the word addresses of the storage units stored in all the latch units form the preset range, and the processor changes the preset range by changing the high bits of the word addresses of the storage units stored in the latch units.

2. The computer system according to claim 1, wherein the addressing assembly comprises a first decoder unit, the inputs of the first decoder unit are connected to the high bits of the memory address line of the processor, the outputs of the first decoder unit are connected respectively to each latch unit, and the first decoder unit gates a corresponding latch unit for output according to the high bits of the memory address formed by the processor.

3. The computer system according to claim 2, wherein the addressing assembly comprises a second decoder unit, the inputs of the second decoder unit are connected respectively to the outputs of each latch unit, the outputs of the second decoder unit are connected to the storage, and the second decoder unit is configured to address the high bit portion of the word address of the storage according to the high bits of the word address of the storage that are output from the selected latch unit.

4. The computer system according to claim 3, wherein the second decoder unit is mainly formed of a set of decoder chips.

5. The computer system according to claim 2, wherein the first decoder unit is mainly formed of a set of decoder chips.

6. The computer system according to claim 1, wherein the storage unit of the storage is divided into a plurality of regions of the same size according to the word address, and the high bits of the word address stored in each latch are the high bits of the first address of the region; and when the processor changes the high bits of the word address of the storage unit stored in the latch unit, the processor selects a region where a current target file resides, and assigns the high bits of the first address of the selected region to one latch unit.

7. The computer system according to claim 1, wherein the plurality of latch units comprises at least one first-class latch unit and the high bits of the word address of the storage unit stored in the first-class latch unit are non-modifiable.

8. The computer system according to claim 7, wherein the region where the word address corresponding to the high bits of the word address of the storage unit stored in the first-class latch unit resides is configured to store an operating system.

9. The computer system according to claim 1, wherein the latch unit is mainly formed of a set of latches.

10. A data read/write method, applied to the computer system according to claim 1, comprising specifically:
- Step 1: determining whether a target file of a read/write request is stored in a set of storage units currently covered by the preset range, wherein if the target file is stored in the set of storage units currently covered by the preset range, Step 2 is performed, or otherwise, Step 6 is performed;
- Step 2: generating a memory address by the processor, wherein high bits of the memory address are sent to the addressing assembly, and low bits of the memory address are sent to the storage;
- Step 3: converting the high bits of the memory address into high bits of a corresponding word address of the storage and outputting the high bits to the storage by the addressing assembly;
- Step 4: combining the high bits of the word address that are output from the addressing assembly and the low bits of the memory address into a word address of the storage, and gating a storage unit corresponding to the word address to connect with the processor, for performing a read/write operation;
- Step 5: performing a read/write operation on data bus in a current working memory by the processor by means of memory read/write, and exiting to wait for a next read/write request; and
- Step 6: changing the set of storage units of the storage covered by the preset range by the processor, such that the target file of the read/write request resides in the set of storage units of the storage covered by the preset range, and continuing the process by proceeding to Step 2.

11. The data read/write method according to claim 10, wherein the addressing assembly comprises a first decoder unit, the inputs of the first decoder unit are connected to the high bits of the memory address line of the processor, the outputs of the first decoder unit are connected respectively to each latch unit, and the first decoder unit gates a corresponding latch unit for output according to the high bits of the memory address formed by the processor.

12. The data read/write method according to claim 11, wherein the addressing assembly comprises a second decoder unit, the inputs of the second decoder unit are connected respectively to the outputs of each latch unit, the outputs of the second decoder unit are connected to the storage, and the second decoder unit is configured to address the high bit portion of the word address of the storage according to the high bits of the word address of the storage that are output from the selected latch unit.

13. The data read/write method according to claim 12, wherein the second decoder unit is mainly formed of a set of decoder chips.

14. The data read/write method according to claim 11, wherein the first decoder unit is mainly formed of a set of decoder chips.

15. The data read/write method according to claim 10, wherein the storage unit of the storage is divided into a plurality of regions of the same size according to the word address, and the high bits of the word address stored in each latch are the high bits of the first address of the region; and when the processor changes the high bits of the word address of the storage unit stored in the latch unit, the processor selects a region where the target file of the read/write request resides, and assigns the high bits of the first address of the selected region to one latch unit.

16. The data read/write method according to claim 10, wherein the plurality of latch units comprises at least a first-class latch unit, and the high bits of the word addresses of the storage units stored in the first-class latch unit are non-modifiable.

17. The data read/write method according to claim 16, wherein the region where the word address corresponding to the high bits of the word addresses of the storage units stored in the first-class latch unit is configured to store an operating system.

18. The data read/write method according to claim 10, wherein the latch unit is mainly formed of a set of latches.

* * * * *